United States Patent [19]
Williams

[11] Patent Number: 5,818,272
[45] Date of Patent: *Oct. 6, 1998

[54] DIGITAL INTEGRATION GAIN REDUCTION METHOD

[75] Inventor: Bertrand Jeffrey Williams, Austin, Tex.

[73] Assignee: Cypress Semiconductor Corporation, San Jose, Calif.

[*] Notice: The term of this patent shall not extend beyond the expiration date of Pat. No. 5,767,713.

[21] Appl. No.: 760,304

[22] Filed: Dec. 4, 1996

Related U.S. Application Data

[63] Continuation of Ser. No. 569,682, Dec. 8, 1995.

[51] Int. Cl.⁶ ........................................................ H03L 7/06
[52] U.S. Cl. ............................ 327/156; 327/157; 327/163
[58] Field of Search ..................................... 327/147–150, 327/156–159, 162, 163, 2, 3, 5, 7, 146, 371, 373–376; 331/1 A, 10, 11

[56] References Cited

U.S. PATENT DOCUMENTS

| | | | |
|---|---|---|---|
| 4,504,799 | 3/1985 | Elmis et al. | 331/1 A |
| 4,528,521 | 7/1985 | Grimes | 331/1 A |
| 4,577,163 | 3/1986 | Culp | 327/159 |
| 5,075,640 | 12/1991 | Miyazawa | 331/10 |
| 5,373,255 | 12/1994 | Bray et al. | 327/159 |
| 5,455,540 | 10/1995 | Williams | 331/1 A |
| 5,592,125 | 1/1997 | Williams | 331/1 A |

*Primary Examiner*—Toan Tran
*Attorney, Agent, or Firm*—Bliss McGlynn, P.C.

[57] ABSTRACT

A non-linear integrated phase locked loop circuit includes a phase detector for receiving a data signal and a clock pulse and for outputting a pump-up signal and a pump-down signal, a pulse divider connected to the phase detector for receiving the pump-up signal and the pump-down signal and producing a first output at predetermined multiples of the pump-up signal and a second output at predetermined multiples of the pump-down signal. A pulsed filter or integrator is connected to the pulse divider for receiving the first output and the second output and providing a frequency control signal for a voltage controlled oscillator. A three state amplifier is connected to the phase detector for receiving the pump-up signal and the pump-down signal and providing a phase control signal for a voltage controlled oscillator. The voltage controlled oscillator is connected to the pulsed filter and the amplifier for receiving the frequency control signal and the phase control signal and producing a corresponding output. In a second embodiment, the phase detector outputs a polarity signal and an enable signal along with a pump-up signal and a pump-down signal. The pulse divider is a pulse incrementor/decrementor connected to the phase detector for receiving the polarity signal and the enable signal and producing a first output at a predetermined increment of the polarity signal and a second output at a predetermined decrement of the enable signal.

26 Claims, 3 Drawing Sheets

DIGITAL INTEGRATION GAIN REDUCTION METHOD

This is a continuation of copending application Ser. No. 08/569,682 filed on Dec. 8, 1995.

BACKGROUND OF THE INVENTION

1. Field of the Invention

The present invention pertains to integrator circuits and more particularly to the reduction of gain within an integrator circuit.

2. Related Prior Art

Integrator circuits are used in a many types of electronic circuits. Often problems exist with the gain or amplification in this circuitry. One such of circuit which uses a form of integrator circuit is a phase locked loop system.

Conventional phase locked loop systems consist of common basic elements, a phase detector 12, a filter/integrator 14, and a controlled oscillator 16. This circuit may also include a divider/counter circuit as an option. Controlled oscillator 16 is typically a voltage controlled oscillator, commonly referred to as a VCO. In conventional prior art systems, all of these elements are linear systems having linear gain parameters. These linear systems are easily analyzed with Laplace Transform techniques and other related methods.

FIG. 1 illustrates a typical prior art linear phase locked loop design in block form. Typically, a data or reference signal is received at node 20 of phase detector 12. Phase detector 12 also receives a feedback signal at node 22 from voltage controlled oscillator 16. The signal from voltage controlled oscillator 16 is the signal to be synchronized with the data signal received at node 20. Filter integrator 14 receives signals of pump-up (PUP) and pump-down (PDN) from phase detector 12 and produces an output to voltage controlled oscillator 16. The output signal to voltage controlled oscillator 16 indicates any change necessary in phase to synchronize the phase of voltage controlled oscillator 16 with the phase of the data or reference signal received at node 20.

Conventional prior art has been extended to digital methods of detecting phase in certain system applications. This extension of the linear system into non-linear techniques, although an advancement, still contains room for improvement. Prior art non-linear phase locked loop circuits utilize a split path for voltage controlled oscillator control. The outputs of a non-linear phase detector 30 are a pump-up signal and a pump-down signal, converted from polarity and enable signals within phase detector 30. The pump-up and pump-down signals are fed to separate circuits, filter 32 and three state amplifier 34. These signals are fed to filter 32 for integration to provide a frequency control signal to voltage controlled oscillator 36. These signals are also fed to amplifier 34 for amplification with a three state level conversion. The output signal from amplifier 34 provides a phase control signal to voltage controlled oscillator 36.

FIG. 2 illustrates the architecture for a phase locked loop circuit with non-linear/split VCO control. As in the case of a linear phase locked loop, the non linear phase locked loop includes a phase detector 30, although non-linear, which receives a data or reference signal at node 38 and a clock signal at node 40 from voltage controlled oscillator 36. However, as stated previously, in the non-linear case the output from phase detector 30 includes two signals, a pump-up signal and a pump-down signal.

The prior art techniques and circuit forms for phase locked loop circuits have limitations in application and do not adequately address problems such as the reduction in gain of the integrator block for many applications. The linear system integrator utilizes control of currents and/or analog current or voltage divider circuits to reduce integrator gain. The limitations of these methods is readily apparent. Current can be reduced only so far within the requirements of system speeds and pulse widths. Analog divider circuits have fixed bias requirements and precision matching requirements which become very critical to performance. In addition, in linear systems, the pulse widths seen by the integrator are of a variable nature and thus the integrator must be designed to be operable over a much wider range of pulse widths.

SUMMARY OF THE INVENTION

In prior art, the digital phase detector has never been applied to take advantage of the digital method proposed by the present invention to reduce gains in phase locked loop systems. The digital phase detector also introduces very complicated analytical requirements involving non-linear elements. A closed form analysis method for these systems does not exist, empirical methods must be used.

The present invention is an innovation which can be used in the techniques associated with the design of low bandwidth integrated phase locked loop systems. This advancement is in the area of reduction of integrator gain within these PLL systems. The reduction of integrator gains allows for the reduction of band-widths in the closed loop PLL, allowing for complete integration of the PLL into a monolithic integrated circuit with no external passive or active component requirements. The general scope of this invention applies to non-linear systems based upon a three state "Bang-Bang" phase detector design.

One of the advantages of the present invention lies in the improved performance characterized by reduced PLL bandwidths and complete integration into monolithic silicon without external components. These improvements through the use of the present invention significantly increase the market competitiveness over the prior art designs and are a revolutionary approach rather than an incremental improvement to the technology. The addition of the digital divider allows for the use of small on die capacitor integrator structures to accomplish feats heretofore requiring external components.

The use of the present invention provides a non-linear integrated phase locked loop circuit which includes a phase detector for receiving a data signal and a clock pulse. This detector produces a pump-up signal and a pump-down signal. A pulse divider is connected to the phase detector for receiving the pump-up signal and the pump-down signal and producing a first output at predetermined multiples of the pump-up signal and a second output at predetermined multiples of the pump-down signal. A pulsed filter or integrator is connected to the pulse divider for receiving the first output and the second output and providing a frequency control signal for a voltage controlled oscillator. A three state amplifier is connected to the phase detector for receiving the pump-up signal and the pump-down signal and providing a phase control signal for a voltage controlled oscillator. The voltage controlled oscillator is connected to the pulsed filter and the amplifier for receiving the frequency control signal and the phase control signal and producing a corresponding output.

In a second embodiment, the phase detector outputs a polarity signal and an enable signal along with a pump-up signal and a pump-down signal. The pulse divider is a pulse incrementor/decrementor connected to the phase detector for receiving the polarity signal and the enable signal and producing a first output at a predetermined increment of the polarity signal and a second output at a predetermined decrement of the enable signal.

DESCRIPTION OF THE PREFERRED EMBODIMENTS

The present invention utilizes an additional logical block inserted between the phase detector and the integrator blocks in a phase locked loop system with non-linear/split VCO control in order to digitally reduce the effective integrator gain terms accommodating the requirements for lower bandwidths and improved loop stability.

Figure 1:
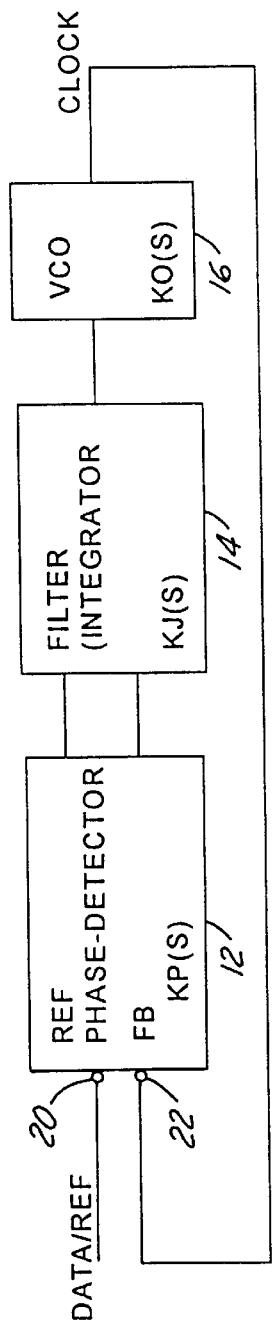
FIG. 1 is a circuit diagram of a typical prior art linear phase locked loop system.
Figure 2:
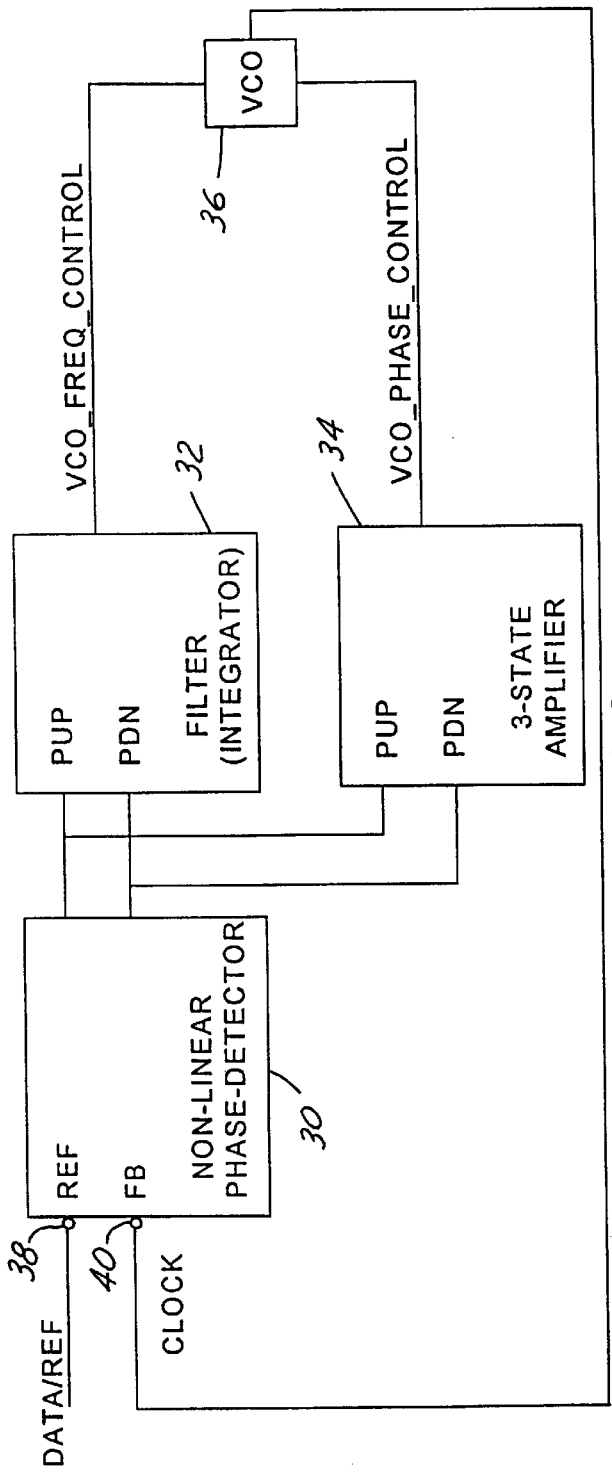
FIG. 2 is a circuit diagram of a typical prior art non-linear phase locked loop system with split voltage controlled oscillator control.
Figure 3:
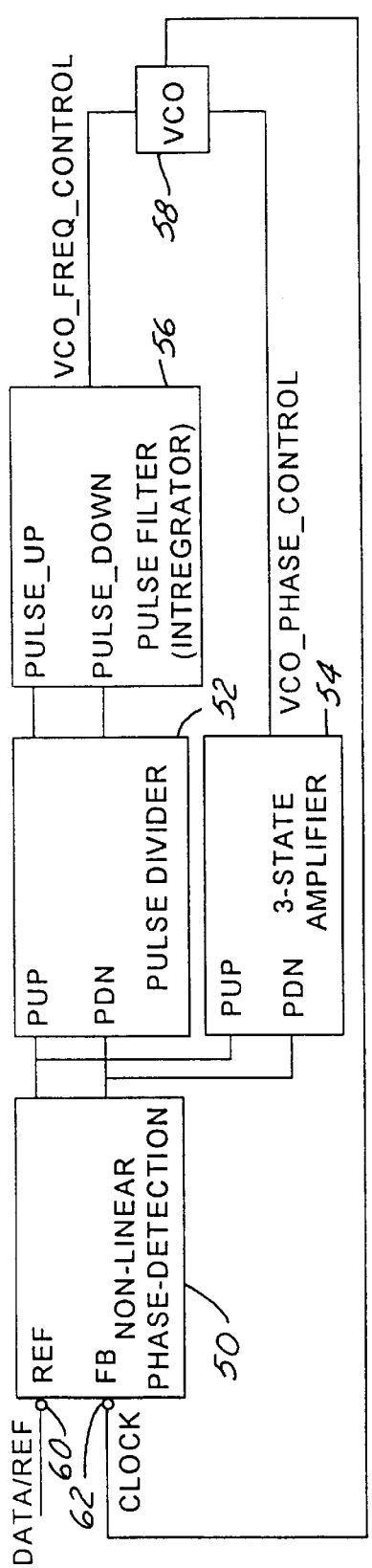
FIG. 3 is a circuit diagram of a non-linear phase locked loop system using a pulse divider to digitally reduce integration gain.

FIG. 3 is a block diagram illustrating a system using the circuit structure of the preferred embodiment. Included are a non-linear phase detector 50, a pulse divider 52, a three state amplifier 54, a pulsed filter (integrator) 56 and a voltage controlled oscillator 58. Non-linear phase detector 50 receives an input of a data or a reference signal at node 60 and a clock signal at node 62. The signal at node 60 is the signal with which the clock signal at node 62 is to be synchronized. Phase detector 50 compares these two signals has the capability to produce two sets of outputs. Phase detector 50 can produce outputs of a polarity signal and an enable signal as one set and produce outputs of a pump-up and a pump-down signal as a second set. In the first embodiment, only the pump-up and pump-down signals are used. These signals are fed to pulse divider 52 and three state amplifier 54. Pulse divider circuit 52 produces a single pulse output in response to multiple input pulses from phase detector 50. This scaled down representation of the pump-up and pump-down signals are fed to pulsed filter 56, which produces a signal that controls the frequency of voltage controlled oscillator 58. Three state amplifier 54 receives the pump-up and pump-down signals directly and produces an output signal that controls the phase of voltage controlled oscillator 58. The frequency and phase of voltage controlled oscillator 58 are modified in response to the signals received from amplifier 54 and pulsed filter 56 and produces an output signal that is fed back to phase detector 50 for further comparison.

Figure 4:
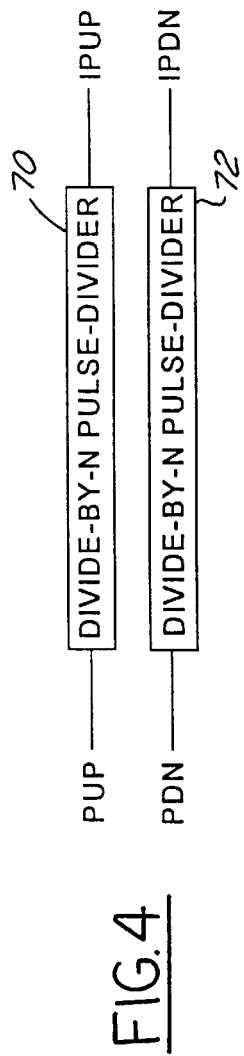
FIG. 4 is a block diagram of a first embodiment of the present invention.

Referring now to FIG. 4, a block diagram of a first embodiment of the present invention is illustrated. Divide-by-N block 70 receives a pump-up (PUP) signal and produces a scaled output (IPUP) in response. Similarly, divide-by-N block 72 receives a pump-down (PDN) signal and produces a scaled output (IPDN) in response. The circuit design of integrator 56 with the architecture of the preferred embodiment is simplified by restricting pulses fed to pulsed filter (integrator) 56 to be exactly half of a clock period in width, though, by design, this may be any fixed width and half of a clock period is easily generated. Divider 52 merely allows one PUP or PDN pulse through for every N pulses applied at each of the PUP and PDN inputs independently.

There are several possible implementations of this architecture. The simplest conceptual form, which is illustrated in FIG. 4 as the preferred embodiment, consists simply of two divider blocks 70 and 72, each applied to a PUP or PDN signal. With an N of sixty-four, for example, the IPUP signal is pulsed for every sixth-fourth pulse received on the PUP signal. The process is similar for the IPDN signal. The method of the present invention effectively counts exactly each and every PUP and PDN pulse and outputs an equivalent balance of IPUP and IPDN pulses respectively.

Figure 5:
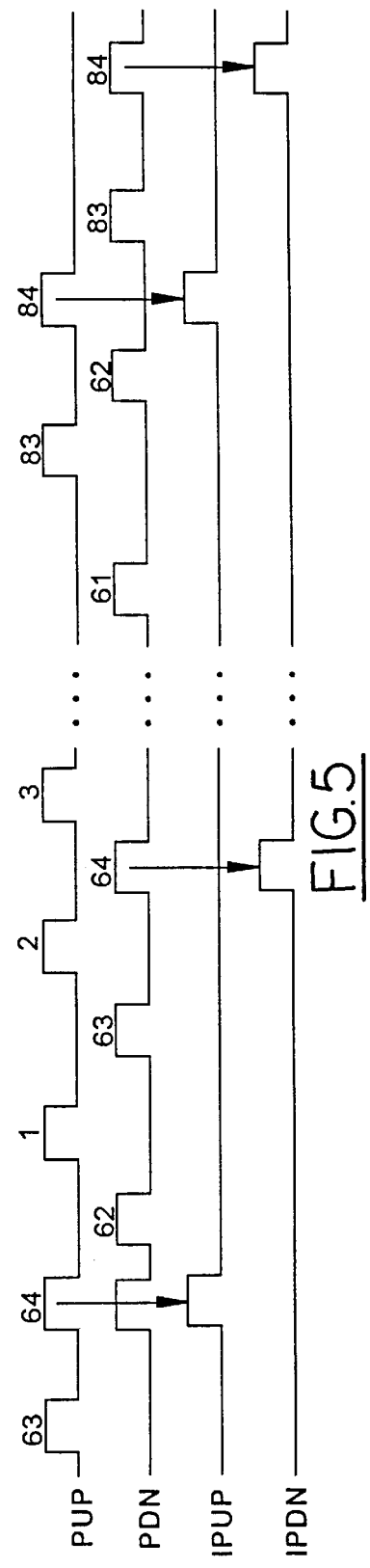
FIG. 5 is a graphical representation of the pulse input to and the pulse output from the circuit of FIG. 4.

FIG. 5 is a graphical representation of the pulse input to and the pulse output from each of block 70 and 72. In this embodiment N is equal to sixty-four, however, any multiple is satisfactory to reduce the gain in the signal fed to pulsed filter or integrator 56.

Figure 6:
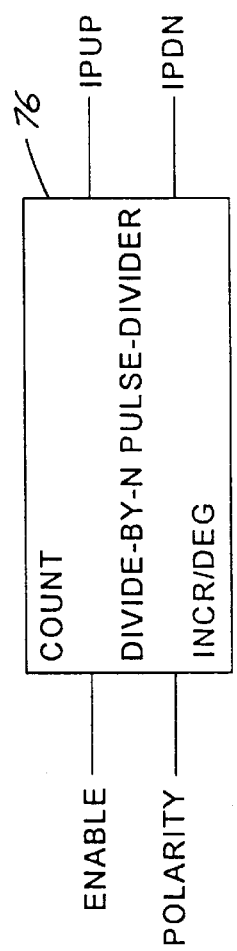
FIG. 6 a block diagram of a second embodiment of the present invention.

In FIG. 6 a block diagram of a second embodiment of the present invention is illustrated. In this embodiment the polarity and enable signals produced by phase detector 50 are used in conjunction with an increment/decrement divide-by-N divider 76 to produce outputs of IPUP and IPDN. This second embodiment incorporates an incrementor/decrementor arrangement which utilizes a single counter to generate a single PUP or PDN output as it reaches its range extremes. This embodiment incorporates the Enable and Polarity signals from the phase detector directly into a functional equivalent of COUNT and INCREMENT/DECREMENT.

Figure 7:
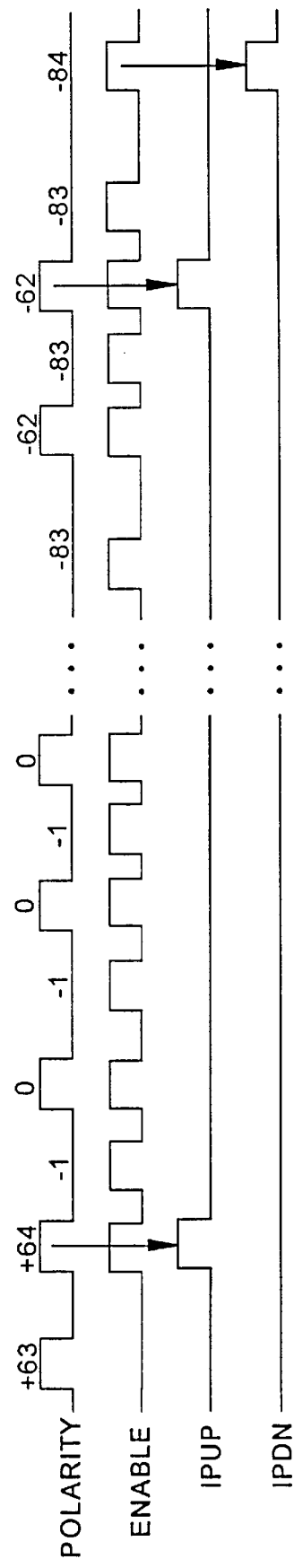
FIG. 7 is a graphical representation of the pulse input to and the pulse output from the circuit of FIG. 6.

As illustrated in FIG. 7 an increment, for example, to an N of sixty-four causes the output of an IPUP pulse. The counter then rolls over back to the zero state. Decrement to minus sixty-four causes a similar occurrence on the IPDN signal. This embodiment simplifies the balance of IPUP and IPDN signals to a condition of number of PUP pulses compared to number of PDN pulses. Rather than outputting a pulse at IPUP or IPDN at each sixty-fourth pulse in each input, this embodiment does not output any signal on either IPUP or IPDN until the difference in number of pulses exceeds the threshold set by the count sequence. On average, the information contained in the IPUP/IPDN signal streams is equivalent to the result from the two counter approach, but this embodiment introduces pulses only if they are required to compensate for imbalance and leaves the integrator static under normal circumstances. This effect could be a small but desirable difference in reducing overall noise injected into the system, but the design of an increment/decrement counter is substantially more complicated and involved over the two counter solution.

The combination of the use of a digital non-linear phase detector with the addition of a digital counter based pulse divider into the integrator path is believed to be unique. The use of the addition of a digital divide structure into the integrator path is claimed, this is specifically noted for use within the scope of a non-linear phase locked loop system based around a three state output "Bang-Bang" type phase detector. This use of digital dividing for the purpose of reducing integrator gain has not been attempted or implemented in prior art.

The present invention provides a method and architecture innovation. Alternate methods of practicing the present invention may consist of variations in circuit technologies and topologies for implementation of the required logic as well as variations in equivalent logic to implement the architectural functions.

While there has been illustrated and described a particular embodiment of the present invention, it will be appreciated that numerous changes and modifications will occur to those skilled in the art, and it is intended in the appended claims to cover all those changes and modifications which fall within the true spirit and scope of the present invention.

I claim:

1. An integrated circuit comprising:

phase detector means for receiving a data signal and a clock pulse and for presenting a pump-up signal and a pump-down signal;

pulse divider means connected to said phase detector means for receiving said pump-up signal and said pump-down signal and providing a first output at predetermined multiples of said pump-up signal and a second output at predetermined multiples of said pump-down signal; and filter means connected to said pulse divider means for receiving said first output and said second output and providing a frequency control signal to control the frequency of the clock pulse.

2. The circuit according to claim 1 further comprising:

amplifier means connected to said phase detector means for receiving said pump-up signal and said pump-down signal and providing a phase control signal to control the frequency of the clock pulse.

3. The circuit according to claim 2 further comprising:

oscillator means connected to said filter means and said amplifier means, said oscillator means for receiving said frequency control signal and said phase control signal and providing the clock pulse.

4. The circuit according to claim 1 wherein said pulse divider means comprises a divide-by-N pulse divider for said pump-up signal and a divide-by-N pulse divider for said pump-down signal.

5. The circuit according to claim 4 wherein said divide-by-N pulse dividers comprise divide-by-64 pulse dividers.

6. An integrated circuit comprising:

phase detector means for receiving a data signal and a clock pulse and for providing a polarity signal and an enable signal;

pulse incrementor/decrementor type divider means connected to said phase detector means for receiving said polarity signal and said enable signal and providing a first output at a predetermined increment and a second output at a predetermined decrement; and filter means connected to said pulse incrementor/decrementor means for receiving said first output and said second output and providing a frequency control signal to control the frequency of the clock pulse.

7. The circuit according to claim 6 further comprising amplifier means connected to said phase detector means for receiving said polarity signal and said enable signal, said amplifier means for providing a phase control signal to control the phase of the clock pulse.

8. The circuit according to claim 7 further comprising:

oscillator means connected to said filter means and said amplifier means, said oscillator means for receiving said frequency control signal and said phase control signal and producing the clock pulse.

9. An integrated circuit comprising:

detector means for receiving a data signal and a clock pulse, said detector means for providing a pump-up signal and a pump-down signal;

logic divider means connected to said detector means for receiving (i) said pump-up signal and (ii) said pump-down signal, said logic divider means for providing a first output at a predetermined multiple of said pump-up signal and a second output at a predetermined multiple of said pump-down signal; and filter means connected to said logic divider means for receiving said first output and said second output and providing a control signal in response thereto to control the clock pulse.

10. An integrated circuit according to claim 9 wherein said filter means includes a linear analog filter.

11. An integrated circuit according to claim 9 wherein said divider means includes means for receiving pulsed signals.

12. An integrated circuit comprising:

phase detector means for receiving a data signal and a clock pulse and for presenting a polarity signal and an enable signal;

incrementor/decrementor type divider means connected to said detector means for receiving said polarity signal and said enable signal and providing a first output at a predetermined increment and a second output at a predetermined decrement; and filter means connected to said incrementor/decrementor means for receiving said first output and said second output and providing a control signal to control the frequency of the clock pulse.

13. An integrated circuit according to claim 12 wherein said filter means includes a linear analog filter.

14. An integrated circuit according to claim 12 wherein said incrementor/decrementor means includes means for receiving pulsed signals.

15. An integrated circuit comprising:

a phase detector configured to (i) receive an input signal, (ii) receive a clock pulse and, (iii) produce at least one set of output signals;

a pulse divider configured to (i) receive said set of output signals, and (ii) produce a pulse output at a predetermined multiple of at least one of said set of output signals; and a filter configured to (i) receive said pulse output and (ii) produce a control signal in response thereto.

16. The circuit according to claim 15 wherein:

said set of output signals comprise a pump-up signal and a pump-down signal;

said control signal comprises a frequency control signal; and said input comprises a data signal.

17. The circuit according to claim 16 further comprising:

an amplifier configured to (i) receive said pump-up signal, (ii) receive said pump-down signal and (iii) provide a phase control signal.

18. The circuit according to claim 17 further comprising:

an oscillator circuit configured to (i) receive said frequency control signal, (ii) receive said phase control signal and (iii) produce said clock pulse.

19. The circuit according to claim 16 wherein said pulse divider comprises:

a first divide-by-N pulse divider for said pump-up signal; and a second divide-by-N pulse divider for said pump-down signal.

20. The integrated phase locked loop circuit of claim 15, wherein:
   said set of output signals comprise a polarity signal and an enable signal; and
   said pulse output comprises a pump-up output at a predetermined increment and a pump-down output at a predetermined decrement.

21. The circuit according to claim 20 further comprising:
   an amplifier configured to (i) receive said polarity signal, (ii) receive said enable signal and (iii) produce a phase control signal to control the phase of the clock pulse; and
   an oscillator configured to (i) receive said control signal from said filter, (ii) receive said phase control signal and (iii) produce said clock pulse.

22. The circuit of claim 17, wherein said phase control signal controls the clock pulse.

23. An integrated circuit according to claim 22 wherein:
   said filter comprises a linear analog filter; and
   said pulse divider comprises a pulse circuit configured to receive pulsed signals.

24. A method for phase locking a clock signal, comprising the steps of:
   generating at least one set of output signals in response to an input signal and said clock signal;
   generating in response to said output signals, a locked clock signal that oscillates at a predetermined multiple of at least one of said output signals; and
   generating a phase locked clock signal in response to said locked clock signal transitioning within a predetermined time of said output signals.

25. The method according to claim 24 wherein said locked clock signal comprises a frequency control signal.

26. The method according to claim 24 wherein said locked clock signal comprises a phase control signal.

* * * * *